United States Patent [19]

Carvel

[11] Patent Number: 4,508,933
[45] Date of Patent: Apr. 2, 1985

[54] ELECTRIC OUTLET COVER

[75] Inventor: Thomas Carvel, Chauncey, N.Y.

[73] Assignee: Carvel Corporation, Yonkers, N.Y.

[21] Appl. No.: 471,110

[22] Filed: Mar. 1, 1983

[51] Int. Cl.³ .............................................. H05K 5/03
[52] U.S. Cl. ..................................... 174/67; 339/44 R
[58] Field of Search ................... 174/66, 67; 220/241, 220/242; 339/36, 37, 39, 44 R

[56] References Cited

U.S. PATENT DOCUMENTS

| | | | |
|---|---|---|---|
| 2,916,733 | 12/1959 | Hirsch | 174/67 X |
| 3,140,344 | 7/1964 | Slater et al. | 174/67 |
| 3,467,763 | 9/1969 | Shaw | 174/67 |
| 3,811,104 | 5/1974 | Caldwell | 339/39 |

OTHER PUBLICATIONS

CQ Magazine, Jul. 1979, vol. 35, No. 7, p. 87.

Primary Examiner—A. T. Grimley
Assistant Examiner—D. A. Tone
Attorney, Agent, or Firm—Jordan and Hamburg

[57] ABSTRACT

An electric outlet cover comprises a base plate having at least one opening and locking means, a cover plate hingedly connected to the base plate for covering an electric outlet when the outlet is not used, and at least one supporting means connected to the cover plate. The base plate is adapted to be disposed adjacent to the electric outlet so that the outlet registers with the opening for insertion of an electric plug into the outlet through the opening. The cover plate includes a closure element adapted to engage the locking means when the cover plate is placed over the base plate. The supporting means is adapted to support an insulated electric conductor when the electric plug connected to the conductor is received in the outlet so that the plug is retained in the outlet despite unintended movement of the wire.

5 Claims, 6 Drawing Figures

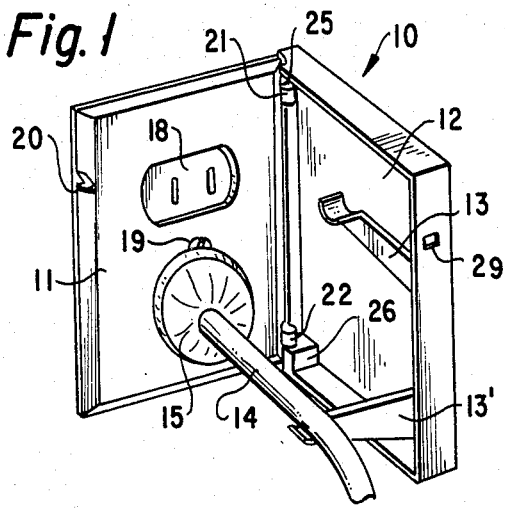
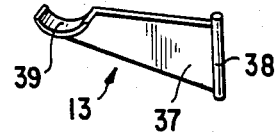
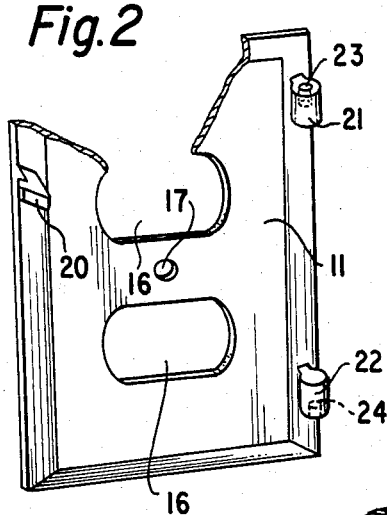
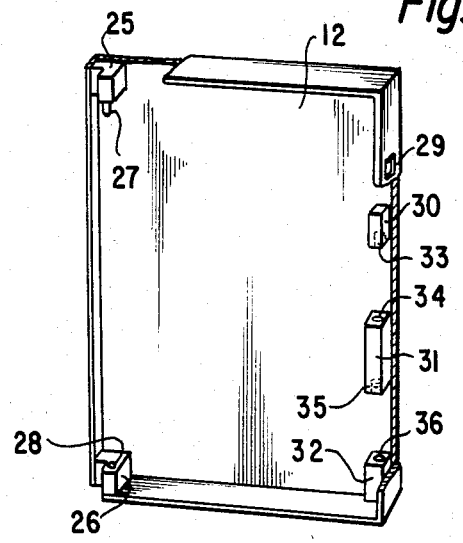
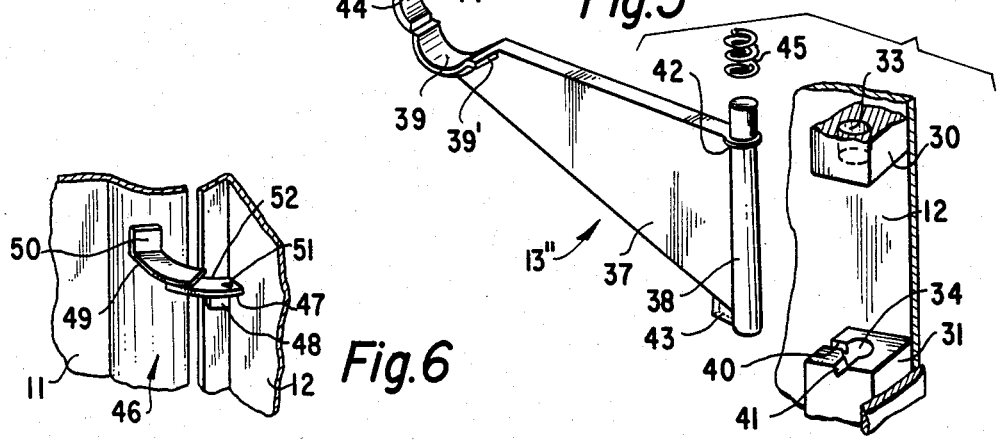

ELECTRIC OUTLET COVER

BACKGROUND OF THE INVENTION AND PRIOR ART STATEMENT

The present invention relates to an electric outlet cover, more particularly, a safety cover for an electric outlet which covers the outlet when the outlet is not used, and which supports the insulated conductor of a power cord to help assure firm engagement of the power cord plug in the outlet when the outlet is used.

Obviously, an electric outlet is dangerous for infants and small children because their curiosity and innocence may lead them to probe the outlet. Therefore, it is preferable to provide a safety cover for covering the outlet when the outlet is not used.

Outlets are sometimes located behind furniture or appliances and, in such cases, are accessible only with inconvenience. Therefore, it is preferable that the cover be mounted at the outlet whether or not the cover is in use. In some cases, furniture or an appliance may be closely located in front of the outlet. Therefore, the outlet cover should be made as thin as possible so as not to interfere substantially with the arranging of furniture or appliances close to the wall having the outlet.

Further, it is important that when a power cord plug is inserted into an outlet, the plug be supported and kept in firm engagement with the outlet. Such support should prevent unintended disengagement of the plug from the outlet due to the weight of the insulated conductor or the plug. This is especially a potential problem when the power cord is for an appliance, such as a freezer chest, having a relatively large power requirement, in which case the insulated conductor and the plug of the power cord are generally rather heavy. It is also desirable that such support prevent or deter an infant or small child from pulling the plug out of the outlet, whereby electric shock may be possibly prevented.

U.S. Pat. No. 4,070,078 discloses a safety cover for enclosing an electric outlet so that the electric plugs inserted therein are kept out of the reach of children. The safety cover includes a plate mounted over the electric outlet and a pair of latching elements. A pair of hollow closure elements are hingedly connected to the plate, so that the closure elements can enclose the sockets and electric plugs therein, and are closed by the latching elements.

In U.S. Pat. No. 2,891,102, an electrical outlet protector comprises a box-like structure having a sleeve therein and a cover plate. The cover plate can be attached to the box-like structure by a screw which engages the sleeve. The socket and the electric plugs are covered in the box-like structure by the plate.

U.S. Pat. No. 2,510,745 discloses a plastic cover that fits over a frame of a receptacle for plugs. The socket and the electric plugs are covered by the cover.

In the above prior art patents, the cover or protector is deep enough to accommodate the plug so that furniture or appliances must be spaced in front of the outlet by a greater than normal distance even when the outlet is not in use. Moreover, the protective devices of the prior art provide no means for supporting the power cords.

Accordingly, an object of the present invention is to provide an electric outlet cover which does not unnecessarily occupy space and which prevents infants and children from touching the outlet.

Another object of the invention is to provide an electric outlet cover as stated above, in which when the outlet is used, a power cord can be supported to prevent the plug from falling or being pulled out of the outlet.

A further object of the invention is to provide an electric outlet cover as stated above, which can be easily and economically manufactured.

A still further object of the invention is to provide a supporting device for an electric power cord to keep the plug in engagement with an outlet.

Further objects and advantages thereof will be apparent from the following description of the invention.

SUMMARY OF THE INVENTION

In accordance with the present invention, an electric outlet cover is provided to prevent infants and children from touching the outlet. The outlet cover comprises a base plate having at least one opening and locking means, the base plate being disposed adjacent to an electric outlet so that the receiving face of the outlet is opposed to the opening for insertion of an electric plug into the outlet through the opening, a cover plate hingedly connected to the base plate for covering the receiving face of the outlet when the outlet is not in use, the cover plate having a closure element to be associated with the locking means when the cover plate is placed over the base plate, and at least one supporting means connected to the cover plate. The supporting means is adopted to support an insulated conductor extending from the electric plug to an electric appliance so that retention of the plug in the outlet is not adversely effected by the weight of the plug and insulated conductor or by movement of the insulated conductor beyond the supporting means.

The supporting means comprises an arm, a supporting post connected to an end of the arm and being rotationally attached to the cover plates and a supporting member connected to the opposite end of the arm. Therefore, the arm can be folded inside the cover plate when the cover plate is closed and locked relative to the base plate, and the arm can be unfolded or extended relative to the base plate for the supporting member to support the wire when the plug is put into the outlet.

The supporting means may further include a spring to urge the arm downwardly and a projection situated adjacent to a bottom end of the supporting post. To cooperate with the supporting means, the cover plate includes at least one block for holding the supporting post. The block has at least one notch therein for receiving the projection of the supporting means to thereby immovably hold the supporting means relative to the cover plate. The supporting means may further include a holding member adjacent to the supporting member to immovably hold the wire onto the supporting member.

The electric outlet cover is preferably provided with positioning means connected between the base plate and the cover plate. Consequently, the cover plate can be immovably held in at least one predetermined position relative to the base plate. In this position, the insulated conductor can be held by the supporting means.

BRIEF DESCRIPTION OF THE DRAWINGS

FIG. 1 is a perspective view of one embodiment of an electric outlet cover in accordance with the present invention, in which a plug of an electric appliance power cord is put in an outlet;

FIG. 2 is a partly broken perspective view of a base plate of the electric outlet cover shown in FIG. 1;

FIG. 3 is a partly broken perspective view of a cover plate of the electric outlet cover shown in FIG. 1;

FIG. 4 is a perspective view of support means of the electric outlet cover shown in FIG. 1;

FIG. 5 is an explanatory exploded view of a second embodiment of the support means with a part of the cover plate; and FIG. 6 is a perspective view of positioning means to be connected to the base plate and the cover plate in a second embodiment.

DETAILED DESCRIPTION OF PREFERRED EMBODIMENTS

Referring to FIGS. 1-4, a first embodiment of an electric outlet cover 10 is shown. In this embodiment, the socket cover 10 is designed to cover two outlets on a wall and comrises a base plate 11, a cover plate 12 hingedly connected to the base plate 11, and two supporting devices 13, 13' rotationally connected to the cover plate 12, the supporting device 13' supporting the insulated conductor 14 of a power cord which also includes a plug 15.

The base plate 11 includes two openings 16 and a small hole 17 between the openings 16. The openings 16 register with outlets 18 so that one or more plugs 15 can be inserted into the respective outlets 18 through the respective openings 16. A screw 19 is disposed in the hole 17 to connect the base plate 11 onto the frame of a conventional outlet set. The base plate 11 may conveniently take the place of a conventional outlet wall plate or may be co-mounted with such wall plate. The base plate 11 is provided with a latch 20 at one side, and, at the other side, with upper and lower connectors 21, 22. The upper connector 21 includes a hollow 23 extending downwardly from an upper surface thereof, and the lower connector 22 includes a hollow 24 extending upwardly from a bottom surface of the lower connector 22.

The cover plate 12 is rectangular with flanges at four side edges thereof, and includes upper and lower connectors 25, 26. The upper connector 25 is provided with a pin 27 extending downwardly from the upper connector 25, and the lower connector 26 is provided with a pin 28 extending upwardly from the lower connector 26. The pins 27 engages the hollow 23 of the connector 21, and the pin 28 engages the hollow 24 of the connector 22, so that the cover plate 12 is rotationally connected to base plate 11.

The cover plate 12 includes a hole 29 in the flange at the side opposite the connectors 25, 26. The hole 29 is designed to engage the latch 20 when the cover plate 12 is closed over the base plate 11, so that the cover plate 12 can not be opened unless the latch 20 is pushed or the flange near the hole 29 is pulled outwardly. Therefore, if the cover plate 12 is closed, an infant or child is unlikely to be able to open it, whereby the outlets 18 are isolated from infants and children.

The cover plate 12 is provided with three blocks 30, 31, 32 at the same side as the hole 29. The block 30 includes a hollow 33 at the bottom thereof, the block 31 includes an upper hollow 34 and a bottom hollow 35, and the block 32 includes an upper hollow 36. The blocks 30, 31, 32 rotationally hold the supporting devices 13, 13'.

The supporting devices 13, 13' are exactly the same, and each includes an arm 37, a post 38 and a supporter 39, the post 38 and the supporter 39 being integrally formed with the arm 37 at respective ends of the arm 37. The post 38 of the supporting device 13 is rotationally held in the hollows 33, 34 of the blocks 30, 31, and the post 38 of the supporting device 13' situated below the supporting device 13 is also rotationally held in the hollows 35, 36 of the blocks 31, 32. The supporting devices 13, 13' are therefore rotationally connected to the cover plate 12.

When the cover plate 12 is closed, the supporting devices 13, 13' should be placed inside the cover plate 12 as shown in FIG. 1 for the supporting device 13. Consequently, the cover plate 12 can be turned and locked over the base plate 11. When the plug 15 is to be inserted into the outlet 18, the cover plate 12 is opened by pushing the latch 20 or pulling the flange near the hole 29. When the plug 15 is inserted in the socket 18, as shown in FIG. 1, for example, the supporting device 13' should be turned normal to the cover plate 12 for supporting the insulated conductor 14 connected to the plug 15. Consequently, even if the plug 15 and the wire 14 are bulky and heavy, or the insulated conductor 15 is vibrated by an electric appliance, the plug will be retained in the outlet.

FIGS. 5 and 6 show a second embodiment of the electric outlet cover, in which the movement of a supporting device 13" relative to the cover plate 12 and the movement of the cover plate 12 relative to the base plate 11 are regulated. The base plate 11 and the cover plate 12 are the same as explained before except as hereinafter described.

With reference to FIG. 5, the block 31 includes two notches 40, 41 around the hollow 34. The block 32 also includes a like two notches, but those notches are not shown in the drawings. Further, the supporting device 13" is provided with a flange 42 around the post 38, a projection 43 at the bottom end of the arm 37, and a cover 44 at the supporter 39. When the post 38 of the device 13" is situated in the hollows 33, 34, a spring 45 is inserted between the block 30 and the flange 42 to urge the device 13" downwardly, so that the projection 43 can engage the notch 40 or 41. Therefore, the supporting device 13" can be immovably situated relative to the cover plate 12 at two positions.

When the projection 43 is engaged with the notch 40, the supporting device 13" is located within the cover plate 12. While, when the projection 43 is engaged with the notch 41, the supporting device 13" is oriented perpendicular to the cover plate 12. When the supporting device 13" is to be turned from one of the positions to the other, the application of sufficiently firm pressure to the device 13" in the direction in which the device 13" is to be turned will cause the projection 43 to ride up an inclined wall of the respective notch 40 or 41 in which the projection 43 is engaged and reach the flat top surface of the block 31, whereupon the device 13" can be easily rotated until the projection 43 is engaged by the other notch.

A cover 44 is hinged at one end to the supporter 39. Also, at its other end, the cover 44 is provided with a resilient latch member 44' for engagement under a lip 39' formed on the supporter 39 for releasable locking of the cover 44 to the supporter 39 around the insulated conductor of a power cord. When the insulated conductor 14 is located on the supporter 39 and the cover 44 is closed, the insulated conductor 14 can not be moved because it is held between the supporter 39 and the cover 44.

With reference to FIG. 6, a positioning device 46 is situated between the base plate 11 and the cover plate 12. The positioning device 46 comprises a bottom section having a fan-shaped plate 47 and a flange 48 connected to the cover plate 12, and an upper section having a fan-shaped plate 49 and a flange 50 connnected to the base plate 11. The plate 47 at its upper surface includes three mutually spaced, generally hemispherical depressions 51 (only one depression 51 being shown in FIG. 6). The plate 49 includes a generally hemispherical projection 52 at a front end thereof extending downwardly therefrom. The plate 49 is laid over the plate 47 so that the projection 52 can in turn engage the three depressions 51 when the cover plate 12 is turned relative to the base plate 11. Namely, the projection 52 engages the depressions 51 when the cover plate 12 is turned at 0°, 90° and 180° relative to the base plate 11. In case the projection 52 is engaged with one of the depressions 51, the cover plate 12 is held at that position. Due to the resiliency of the plates 47 and 49, firm pressure on the cover 12 in the direction in which it is to be turned will disengage the projection 52 from whichever depression 51 in which it is engaged.

When the plug is to be inserted into the outlet, preferably, the cover plate 12 is oriented perpendicular to the base plate 11, and the supporting device 13" is extended perpendicular to the cover plate 12. Then, the plug 15 is inserted into the outlet 18, and the cover 44 is closed onto the supporter 39 to hold the insulated conductor 14 thereon. Consequently, if the insulated conductor 14 is pulled or moved the plug 15 is, nevertheless, reliably held in the outlet 18.

In the above embodiments, the cover plate 12 is explained to be a one piece structure. However, the cover plate 12 may be divided into two sections, each section covering one outlet and being provided with means for supporting one insulated conductor; consequently, when only one outlet of a pair is being used, the other may be covered.

While, the invention has been explained with reference to specific embodiments, it is to be noted that the description is illustrative and the invention is limited only by the appended claims.

What is claimed is:

1. An electric outlet cover comprising,
    a base plate having at least one opening and locking means, said base plate being adapted to be disposed adjacent to an electric outlet so that the outlet registers with said opening for insertion of an electric plug into the outlet through the opening,
    a cover plate hingedly connected to said base plate for covering the outlet when the outlet is not used, said cover plate having a closure element adapted to engage said locking means when said cover plate is placed over the base plate, and
    at least one supporting means connected to said cover plate and adapted to support an insulated electric conductor when the electric plug connected to the conductor is received in the outlet so that the plug is retained in the outlet despite unintended movement of the wire, said supporting means including an arm, a supporting post connected to an end of the arm, said supporting post being rotationally attached to said cover plate, and a supporting member connected to the opposite end of the arm relative to the supporting post, so that when the cover plate is closed, the arm can be folded inside the cover plate and the arm can be extended relative to the base plate for supporting of the conductor by the supporting member when the plug is inserted into the outlet.

2. An electric outlet cover according to claim 1, in which said supporting means further includes a spring to urge the arm downwardly and a projection adjacent to a bottom end of the supporting post, and said cover plate further includes at least one block for holding the supporting post, said block having therein at least one notch for receiving the projection of the supporting means to thereby immovably hold the supporting means relative to the cover plate.

3. An electric outlet cover according to claim 2, in which said supporting means further includes a holding member adjacent to the supporting member to immovably hold the conductor onto the supporting member.

4. An electric outlet cover according to claim 1, further comprising positioning means connected between the base plate and the cover plate so that the cover plate can be immovably held at least in one predetermined position relative to the base plate.

5. A supporting device for an electric outlet, comprising
    a base plate adapted to be situated adjacent to the electric outlet,
    a cover plate connected to said base plate, and
    an arm connected to said cover plate and having a supporting member connected to an end of said arm, said supporting member being adapted to support an insulated electric conductor connected to an electric plug when the plug is inserted into an outlet so that the plug is more securely retained in the outlet, said arm, when the arm is not in used, being held inside the cover plate, which can then be folded over the base plate.

* * * * *